(12) United States Patent
Kim et al.

(10) Patent No.: US 6,862,245 B2
(45) Date of Patent: Mar. 1, 2005

(54) DUAL PORT STATIC MEMORY CELL AND SEMICONDUCTOR MEMORY DEVICE HAVING THE SAME

(75) Inventors: Tae-Hyoung Kim, Anyang-si (KR); Tae-Joong Song, Hwasung-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/453,030

(22) Filed: Jun. 3, 2003

(65) Prior Publication Data

US 2004/0004898 A1 Jan. 8, 2004

(30) Foreign Application Priority Data

Jul. 8, 2002 (KR) .................................. 10-2002-0039501

(51) Int. Cl.[7] .............................................. G11C 8/00
(52) U.S. Cl. .......................... 365/230.05; 365/189.05; 365/203
(58) Field of Search ...................... 365/230.05, 189.05, 365/203, 204, 156

(56) References Cited

U.S. PATENT DOCUMENTS 5,754,468 A  5/1998  Hobson ....................... 365/156
6,005,795 A  12/1999  Hawkins et al. ............. 365/156
6,288,969 B1 * 9/2001  Gibbins et al. .......... 365/230.05
6,341,083 B1  1/2002  Wong .......................... 365/154
2002/0174298 A1  11/2002  Hsu et al. ..................... 711/118

FOREIGN PATENT DOCUMENTS

EP  0 365 733  5/1990  ......... H03K/19/177
JP  60-236187  11/1985  ........... G11C/11/34
JP  07-153277  6/1995  ......... G11C/11/418

* cited by examiner

Primary Examiner—David Lam
(74) Attorney, Agent, or Firm—Mills & Onello, LLP

(57) ABSTRACT

The present invention includes a dual port static memory cell and a semiconductor memory device having the same, the dual port static memory cell comprising a first transmission gate having a gate connected to a word line and connected between a bit line and a first node, a second transmission gate having a gate connected to the word line and connected between a complementary bit line and a second node, a latch connected between the first node and the second node, and a PMOS transistor having a gate connected to a scan control line and connected between the second node and a scan bit line.

6 Claims, 7 Drawing Sheets

US 6,862,245 B2

DUAL PORT STATIC MEMORY CELL AND SEMICONDUCTOR MEMORY DEVICE HAVING THE SAME

RELATED APPLICATION

This application claims priority to Korean Patent Application No. 2002-39501, filed on Jul. 8, 2002, entitled, "Dual Port Static Memory Call and Semiconductor Memory Device Comprising the Cell," the contents of which are hereby incorporated by reference in their entirety.

BACKGROUND OF INVENTION

1. Field of the Invention

The present invention relates to a static random access memory (SRAM), and particularly to a dual port static memory cell and a semiconductor memory device including the same.

2. Description of Related Art

Generally, a conventional dual port static memory cell comprises a word line, a pair of bit lines and six transistors connected between a scan control line and a scan bit line so that a read operation and a scan (read) operation may be simultaneously performed.

FIG. 1 illustrates a conventional dual port static memory cell comprising NMOS transistors N1, N2, N3 and N4, and PMOS transistors P1 and P2.

Referring to FIG. 1, the NMOS transistor N1 has a gate connected to a word line WL, a source (drain) connected to a node n1 and a drain (source) connected to a bit line BL. The PMOS transistor P1 and the NMOS transistor N3 form an inverter I1, and the inverter I1 is connected between the node n1 and a node n2. The PMOS transistor P2 and the NMOS transistor N4 form an inverter I2 and the inverter I2 is connected between the node n2 and the node n1. The NMOS transistor N2 has a gate connected to a scan control line SS and a source (drain) and drain (source) connected to the node n2 and scan bit line SL, respectively.

The circuit diagram of the conventional dual port static memory cell in FIG. 1 is disclosed in U.S. Pat. No. 6,005,795 granted to Hawkins, et al. and titled "Single Ended Dual Port Memory Cell".

In the dual port static memory cell shown in FIG. 1, if a read operation and a scan operation are simultaneously performed, a logic "high" level signal is applied to a word line WL and a scan control line SS. Thus, the NMOS transistors N1 and N2 are turned on, and data stored in the nodes n1 and n2 are transferred to the bit line BL and the scan bit lit SL, respectively.

However, since the conventional dual port static memory cell does not employ a pair of bit lines in the cell but only have a single bit line, a differential amplifier may not be used in the read operation. Accordingly, there results a problem that read operation time is long in duration a data read operation.

Further, the conventional dual port static memory cell is disadvantageous in that data can be precisely written into a latch being comprised of the inverters I1 and I2 as long as a boosted voltage which is higher than a power supply voltage VCC is applied to the word line WL during a write operation.

FIG. 2 illustrates a conventional dual port static memory cell in accordance with another example. Circuit configuration of the convention dual port static memory cell in FIG. 2 is the almost same as the cell in FIG. 1 but the cell of FIG. 2 has a PMOS transistor P3 instead of the NMOS transistor N2 in FIG. 1.

The circuit in FIG. 2 is disclosed in U.S. Pat. No. 5,754,468 granted to Hobson, Richard F. and titled "Compact Multiport Static Random Access Memory Cell".

The dual port static memory cell shown in FIG. 2 likewise does not have a pair of bit lines in the cell. Accordingly, a differential amplifier cannot be used for a read operation and therefore data read time is long. Further, a boosted voltage is still required to be applied to the word line WL for a correct data write operation.

FIG. 3 illustrates a dual port static memory cell in accordance with another example of the conventional art, which comprises NMOS transistors N5, N6, N7, N8 and N9, and PMOS transistors P4 and P5.

The NMOS transistor N5 has a gate connected to a word line WL and source (drain) and drain (source) connected to a node n3 and bit line BL, respectively. The PMOS transistor P4 and the NMOS transistor N7 form an inverter I3, and the inverter I3 is connected between the node n3 and a node n4. The NMOS transistor N6 has a gate connected to the word line WL and source (drain) and drain (source) connected to the node n4 and a complementary bit line BLB, respectively. The NMOS transistor N9 has a gate connected to a scan control line SS and source (drain) and drain (source) connected to the node n4 and a scan bit line SL, respectively.

In the dual port static memory cell in FIG. 3, the node n3 and n4 store data of logic "high" and logic "low", respectively, during a write operation. Then, the bit line pair BL/BLB and the scan bit line SL are charged to logic "high" level during a pre-charge operation. At this time, commands for a read operation and a scan (read) operation are simultaneously applied. Assuming the situation above, operation of the dual port static memory cell will be described below.

A logic "high" level signal is applied to the word line WL and the scan control line SS, and the NMOS transistors N5, N6 and N9 are turned on. Then, all positive (+) charges on the complementary bit line BLB and a scan bit line SL are introduced into the node n4 together, and noise signals are applied to the node n4 along with the positive charges. As a result, there results a problem that noise margin decreases.

Accordingly, to reduce noise inflow to the node n3 and n4, the NMOS transistors N7 and N8 must be formed to have wide channel widths so that charges introduced into the node n3 and node n4 can be rapidly discharged. That is, the noise in the node n4 of the circuit in FIG. 3 is almost twice as great as the noise in the node n2 of the circuit having six transistors shown in FIGS. 1 and 2, so that it is necessary to increase a size of the NMOS transistors N7 and N8 to reduce the noise. However, there is a problem that as a size of a transistor increases, layout area of the transistor also increases.

SUMMARY OF THE INVENTION

In an effort to overcome the problems described above, it is a feature of the present invention to provide a dual port static memory cell capable of operating high speed while minimizing layout area.

It is another feature of the present invention to provide a semiconductor memory device including a dual port static memory cell capable of operating at high speed while minimizing layout area.

In accordance with the present invention, the above and other features can be accomplished by the provision of a dual port static memory cell comprising a first transmission gate having a gate connected to a word line and connected between a bit line and a first node, a second transmission gate having a gate connected to the word line and connected between a complementary bit line and a second node, a latch connected between the first node and the second node, and a PMOS transistor having a gate connected to a scan control line and connected between the second node and a scan bit line.

Preferably, the first and second transmission gates are implemented by NMOS transistors.

Preferably, the latch comprises a first CMOS inverter for inverting a signal from the first node and outputting the inverted signal of the first node to the second node, and a second CMOS inverter for inverting a signal from the second node and transmitting the inverted signal of the second node to the first node.

To achieve the feature of the present invention described above, there is provided a semiconductor memory device comprising a plurality of memory cells connected between corresponding pairs of bit lines and corresponding word lines, while being arranged in a matrix, a plurality of scan transistors connected to corresponding scan bit lines, the corresponding memory cells and corresponding scan control lines, while being arranged in a matrix, a pre-charge means for pre-charging the plurality of bit line pairs, and a pre-discharge means for pre-discharging the scan bit lines, wherein each scan transistor includes a PMOS transistor connected between a corresponding memory cell of the memory cells and a corresponding scan control line of the scan control lines, the PMOS transistor having a gate connected to a corresponding scan control line of the scan control lines.

Preferably, each memory cell comprises a first NMOS transistor connected between a bit line of at least one of the bit line pairs and the first node, and having a gate connected to the word line, a second NMOS transistor connected between a complementary bit line of the bit line pair and the second node, and having a gate connected to the word line, and a latch connected between the first node and the second node.

Preferably, the latch comprises a first CMOS inverter for inverting a signal from the first node and transmitting the inverted signal to the second node, and a second CMOS inverter for inverting a signal from the second node and transmitting the inverted signal to the first node.

BRIEF DESCRIPTION OF THE DRAWINGS

These and other features and advantages of the present invention will be readily apparent to those of ordinary skill in the art upon review of the detailed description that follows when taken in conjunction with the accompanying drawings, in which like reference numerals denote like parts.

DETAILED DESCRIPTION OF PREFERRED EMBODIMENTS

Figure 4:
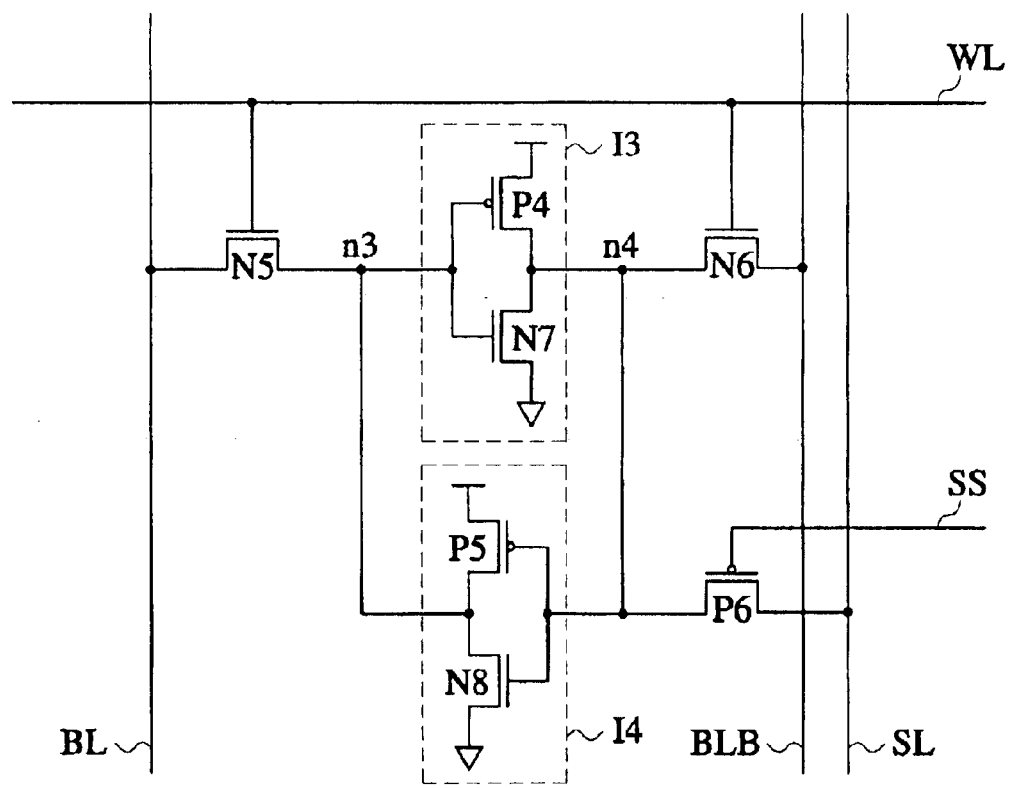
FIG. 4 illustrates a circuit diagram of a dual port static memory cell in accordance with the present invention.

FIG. 4 illustrates a circuit diagram of a dual port static memory cell in accordance with the present invention. Referring to FIG. 4, a dual port static memory cell of the present invention comprises NMOS transistors N5, N6, N7 and N8, and PMOS transistors P4, P5 and P6.

Operation of the circuit in FIG. 4 will be described below.

It is assumed for purposes of description of the invention using an illustrative example that a logic "low" level data and a logic "high" level data are input to a node n3 and node n4, respectively, during a write operation.

Then, during a pre-charge operation, a pair of bit lines BL/BLB are charged to logic "high" level, and a scan bit line SL is pre-discharged to logic "low" level.

In this situation, if a read operation and a scan (read) operation are performed simultaneously, logic "high" level is asserted to a word line WL and logic "low" level is asserted to a scan control line SS, so that the NMOS transistors N5 and N6 and the PMOS transistors P6 are turned on. Than, positive (+) charges on a bit line BL of the bit line pair BL/BLS are drawn to the node n3 and negative (−) charges on the scan line SL are drawn to the node n4. Noise negatively influencing the node n4 in FIG. 4 decreases to a half level in comparison with the noise in the circuit of FIG. 3. That is, the noise is concentrated on the node n4 in the circuit of FIG. 3 but dissipated by the node n3 and node n4 in the circuit of FIG. 4. Accordingly, noise margin is improved.

Figure 1:
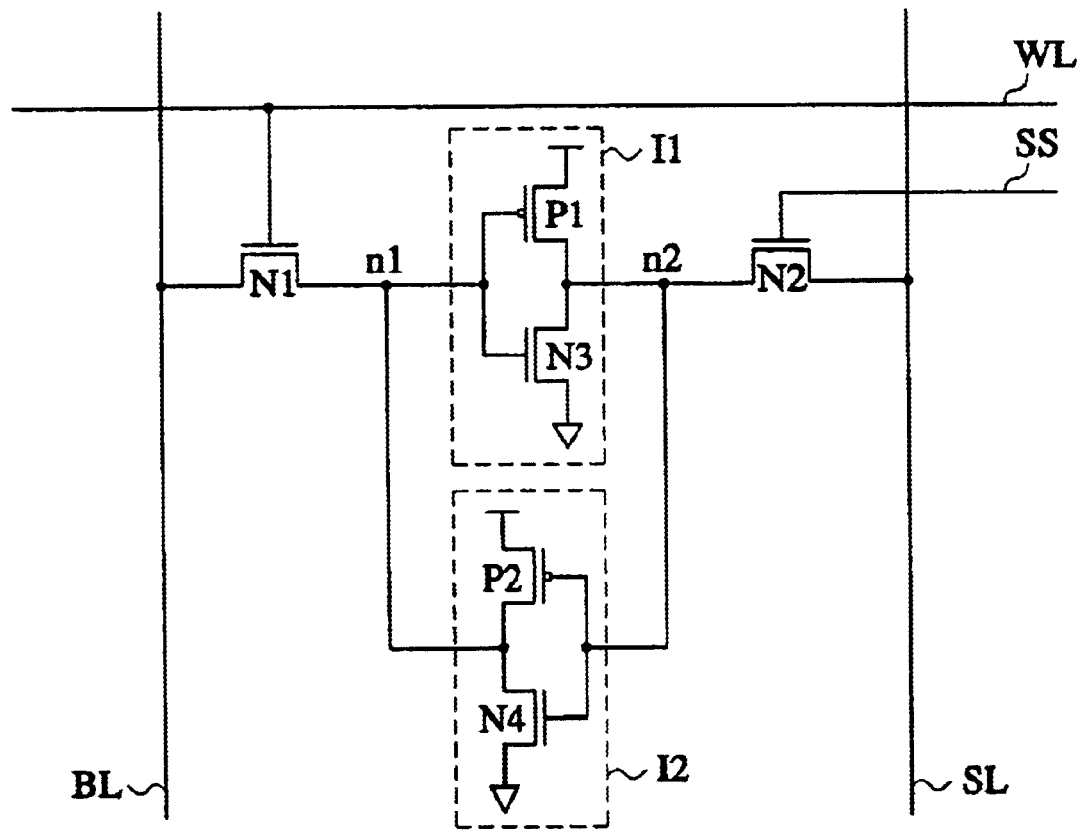
FIG. 1 illustrates a circuit diagram of a dual port static memory cell in accordance with one example of the conventional art.
Figure 2:
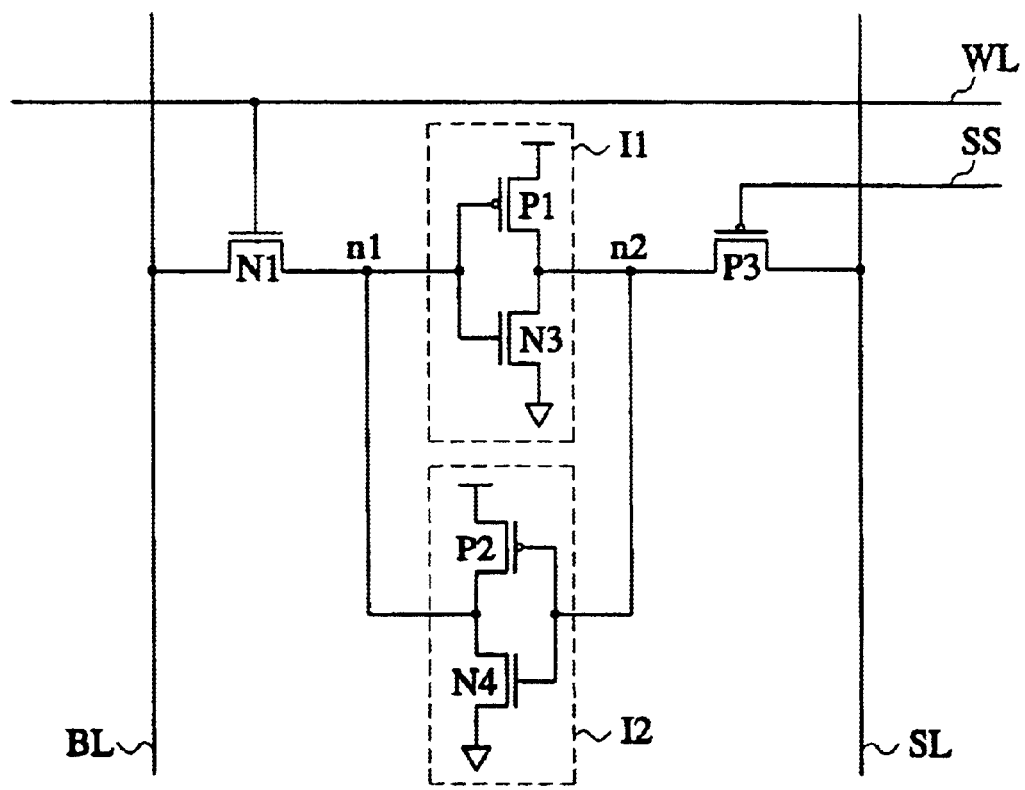
FIG. 2 illustrates a circuit diagram of a dual port static memory cell in accordance with another example of the conventional art.
Figure 3:
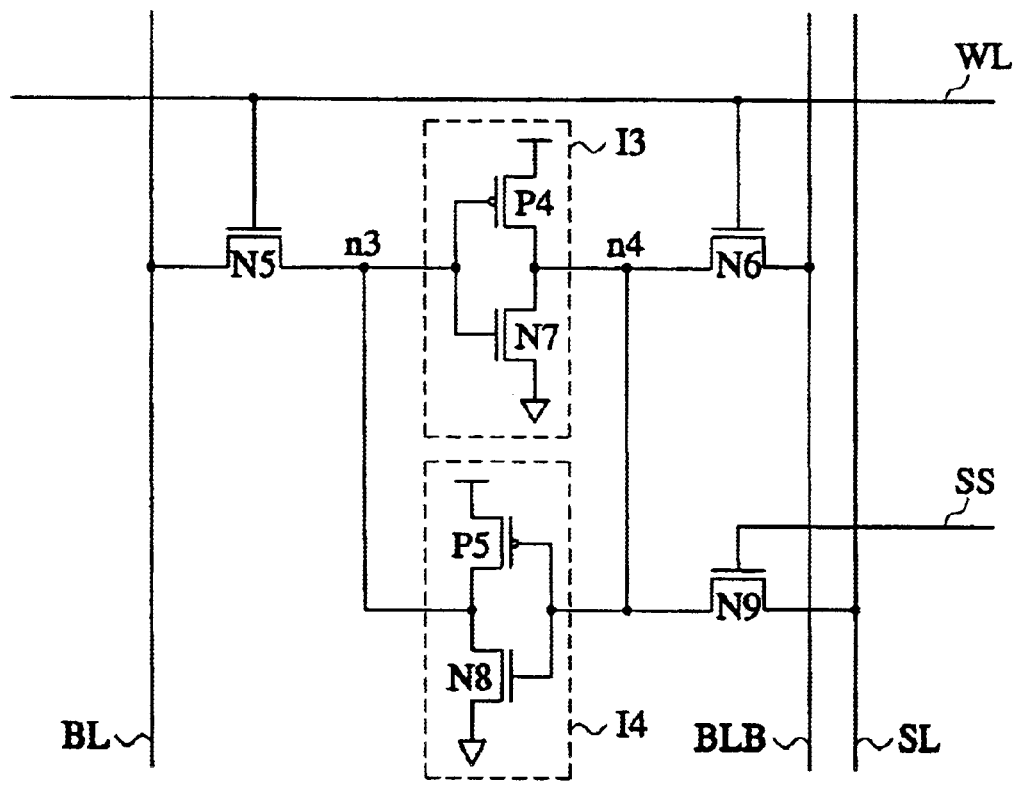
FIG. 3 illustrates a circuit diagram of a dual port static memory cell in accordance with further another example of the conventional art.

That is, since noise causing elements are dispersed to the node n3 and node n4 of the cell latches, the NMOS transistors N7 and N8 of FIG. 4 may be formed in relatively smaller size than that of the NMOS transistors N7 and N8 of FIG. 3. Accordingly, a layout size of the dual port static memory cell can be reduced.

Figure 5:
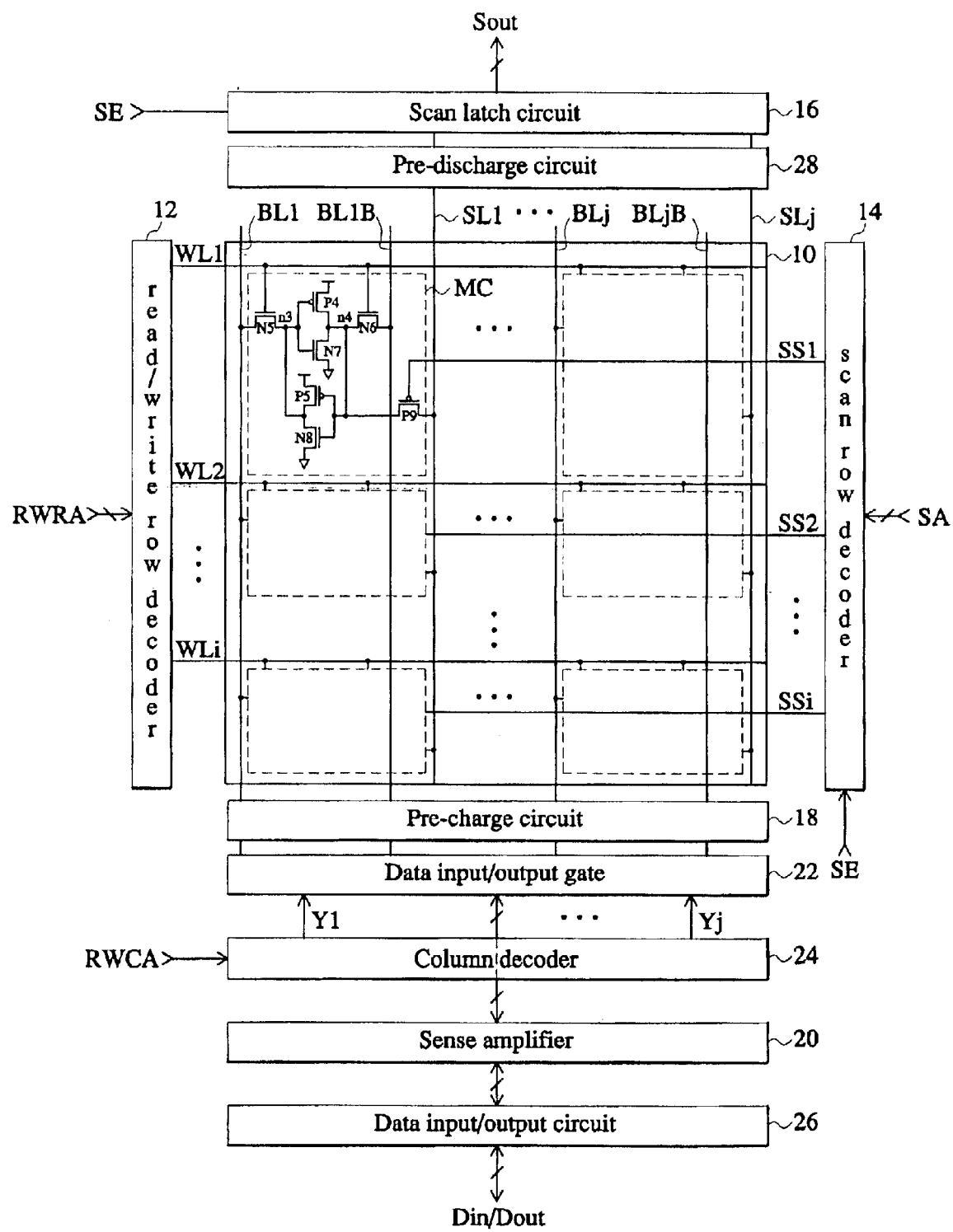
FIG. 5 illustrates a block diagram of a semiconductor memory device including the dual port static memory cell shown in FIG. 4, in accordance with the present invention.

FIG. 5 illustrates a semiconductor memory device including the dual port static memory cell shown in FIG. 4, in accordance with the present invention. Referring to FIG. 5, the semiconductor memory device comprises a memory cell array 10, a read/write row decoder 12, a scan row decoder 14, a scan latch circuit 16, a pre-charge circuit 18, a pre-discharge circuit 28, a data input/output gate 22, a sense amplifier 20, a data input/output circuit 26 and a column decoder 24.

The read/write row decoder 12 decodes a read/write row address RWRA during a read/write operation and selects a word line WL from the word lines WL1-WLi. The scan row decoder 14 decodes a scan address SA and selects a scan control line SS from the scan control lines SS1-SSi. The scan latch circuit 16 latches data output from the scan lines SL1-Slj in response to a scan enable signal SE and generates scan output signals Sout. The pre-charge circuit 18 pre-charges a plurality of bit line pairs BL1/BL1B, . . . , BLj/BLjB and the pre-discharge circuit 28 pre-discharges the scan bit lines SL1-SLJ. The data input/output gate 22 inputs and outputs data from the bit line pairs BL1/BL1B, . . . , BLj/BLjB in response to column selection signals Y1-Yj. The sense amplifier 20 amplifies differential voltage between the respective pair of bit lines BL1/BL1B, . . . , BLj/BLjB. The column decoder 24 decodes a column address RWCA and generates a column selection signal Y out of the column selection signals Y1-Yj during the read/write operation. The data input/output circuit 26 generates output data Dout by receiving the data output from the sense amplifier 20 and transfers input data Din input from a data input pin to a data input/output gate 22.

Operation of the dual port static memory cell of the present invention shown in FIG. 5 will be readily understood with reference to operation of the circuit of FIG. 4.

The operation of the memory device in FIG. 5 will be described below assuming that the read and scan operations are simultaneously performed and logic "high" level and logic "low" level are stored in the nodes n3 and n4, respectively.

During a pre-charge operation, the bit line pairs BL1/BL1B, . . . , BLj/BLjB are pre-charged by the pre-charge circuit 18 to logic "high" level, and the scan bit lines SL1-SLj are pre-discharged by the pre-discharge circuit 28 to logic "low" level.

Next, during a read operation following the pre-charge operation, a word line WL1 is selected by the read/write row decoder 12 and a scan control line SS1 is selected by the scan row decoder 14, so that the NMOS transistors N5, N6 and the PMOS transistor P6 are turned on.

In this situation, the positive charges are introduced into the node n4 from complementary bit lines BL1B-BLjB of the bit line pairs BL1/BL1B, . . . , BLj/BLjB. However, no charge is introduced into the node n4 from the scan bit lines SL1-SLj.

Now, in contrast, it is assumed that logic "low" level and logic "high" level are stored in the nodes n3 and n4. Operation of the device of FIG. 5 will be described below regarding the contrary condition to the condition described above.

During a pre-charge operation, the bit line pairs BL1/BL1B, . . . , BLj/BLjB are pre-charged to logic "high" level and the scan bit lines SL1-SLj are pre-discharged to logic "low" level.

During a read operation following the pre-discharge operation, a word line WL1 is selected by the row decoder 12 and a scan control line SS1 is selected by the scan row decoder, so that the NMOS transistors N5, N6 and the PMOS transistor P6 are turned on.

At this time, the positive charges are introduced into the node n3 from the bit lines BL1-BLj of the bit line pairs BL1/BL1B, . . . , BLj/BLjB but not introduced from the complementary bit lines BL1B-BLjB ot the bit line pairs BL1/BL1B, . . . , BLj/BLjB. Further, the positive charges on the node n4 are transferred to the scan bit lines SL1-SLj. Accordingly, noise causing elements may be dispersed to the node n3 and node n4. As a result, noise margin of the memory cell in the present invention increases. Therefore, the semiconductor memory device in accordance with the present invention is advantageous in that with the increased noise margin, it is not necessary to form the NMOS transistors N7 and N8 in a size larger than that of the conventional semiconductor memory device.

Table 1 shows a simulation result of noise margins of the circuits of FIG. 3 and FIG. 4, wherein the result is obtained by considering various factors capable of influencing the noise margin, such as power supply voltage, temperature and process condition.

TABLE 1

| No | Voltage (V) | Temp. (° C.) | Process Condition | Noise Margin of Circuit in FIG. 3 (V) | Noise Margin of Circuit in FIG. 4 (V) |
|---|---|---|---|---|---|
| 1 | 3 | −55 | FF | 0.0891 | 0.1433 |
| 2 | 3 | −55 | FS | 0.0349 | 0.1599 |
| 3 | 3 | −55 | SF | 0.2911 | 0.1972 |
| 4 | 3 | −55 | SS | 0.2364 | 0.2243 |
| 5 | 3 | 125 | FF | 0.0033 | 0.0820 |
| 6 | 3 | 125 | FS | 0.0648 | 0.1052 |
| 7 | 3 | 125 | SF | 0.2160 | 0.1137 |
| 8 | 3 | 125 | SS | 0.1498 | 0.1515 |
| 9 | 2.5 | 25 | NN | 0.1512 | 0.1586 |
| 10 | 1.8 | 25 | NN | 0.1924 | 0.1474 |

In the process condition item in Table 1, F and S denote a bad condition and a good condition, respectively, and N denotes a normal condition. Further, the first letter indicates a process condition for fabricating NMOS transistors and the second letter indicates a process condition for fabricating PMOS transistors.

As shown in Table 1, in case No. 6, a power supply voltage is 3V, temperature is 125° C., the NMOS transistor is formed under the bad condition and the PMOS transistor is formed under the good condition, the noise margin of the circuit of FIG. 4 is greater than that of the circuit of FIG. 3. That is, the conventional dual port static memory cell may not correctly latch data because operation characteristic is deteriorated in case No. 6.

Figure 6A:
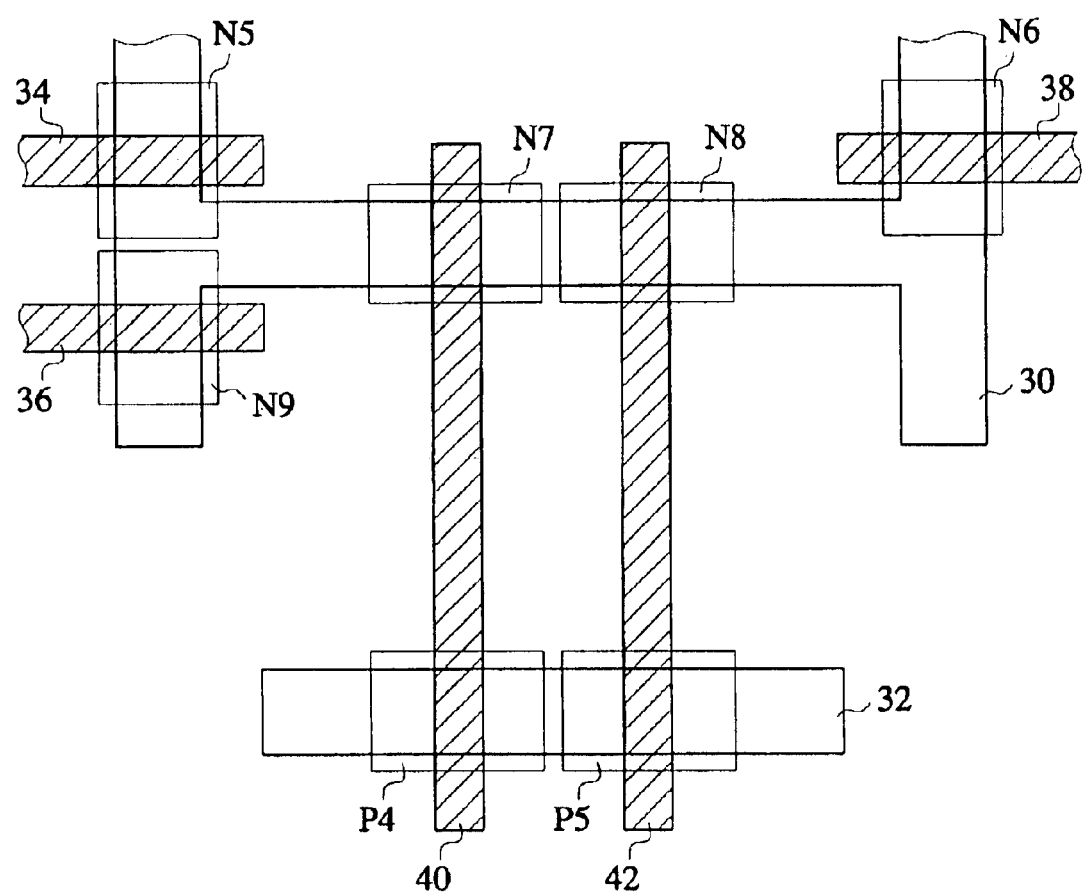
FIG. 6A illustrates a layout diagram of a dual port static memory cell in accordance with the conventional art.

FIG. 6A illustrates a layout diagram of a conventional dual port static memory cell, wherein active regions and gates of the NMOS transistors N5–N9 and PMOS transistors P4 and P5 are shown.

First, an active region for the NMOS transistors N5–N9 is designated by reference numeral 30 and an active region for the PMOS transistors P4 and P5 is designated by reference numeral 32.

Gates 34, 38, 36 of the respective NMOS transistors N5, N6 and N9 are arranged over the active region 30. A common gate 40 of the NMOS transistor N7 and the PMOS transistor P4, and a common gate 42 of the NMOS transistor N8 and the PMOS transistor P5 are arranged over the active regions 30 and 32.

Figure 6B:
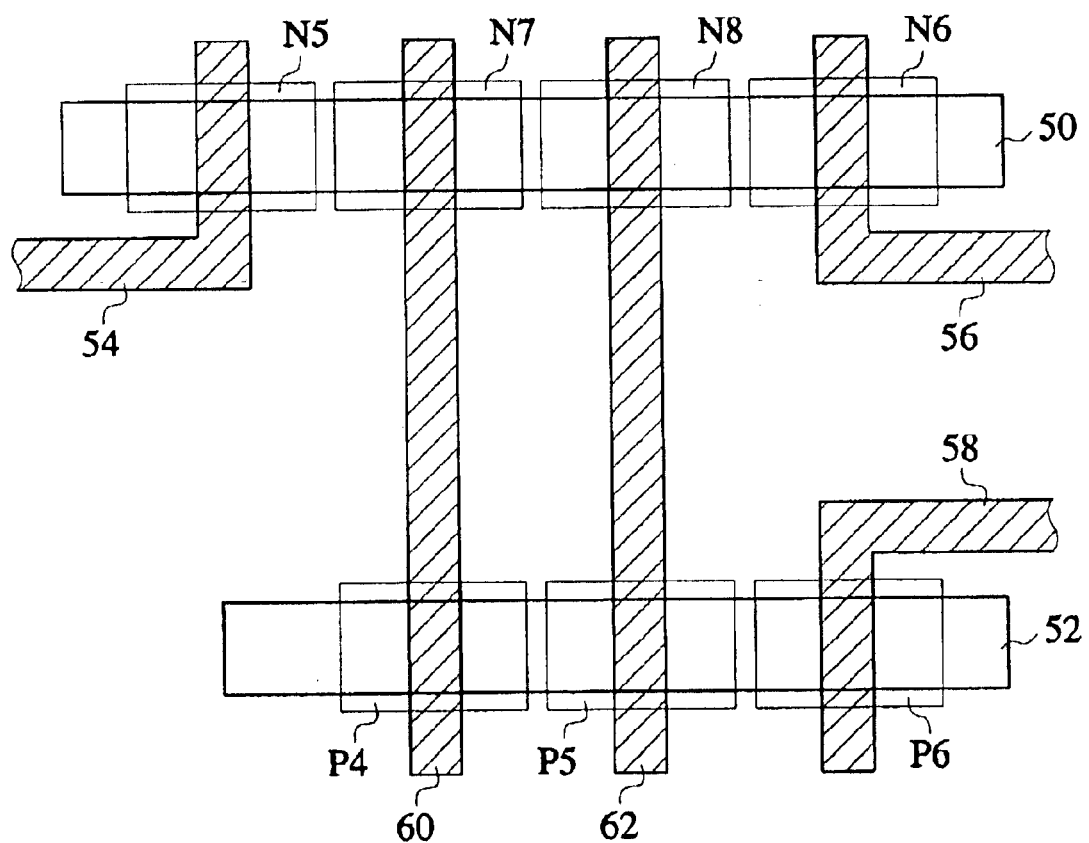
FIG. 6B illustrates a layout diagram of a dual port static memory cell in accordance with the present invention.

FIG. 6B illustrates a layout diagram of a dual port static memory cell of the present invention, wherein active regions and gates of the NMOS transistors N5–N9 and PMOS transistors P4 and P5 are shown.

First, an active region of the NMOS transistors N5–N9 is designated by reference numeral 50 and the active region of the PMOS transistors P4 and P5 is designated by reference numeral 52.

Gates 54, 56 of the corresponding NMOS transistors N5, N6 are arranged over the active region 50. A common gate 60 of the NMOS transistor N7 and PMOS transistor P4, and a common gate 62 of the NMOS transistor N8 and the PMOS transistor P5 are arranged over the active regions 50 and 52. Gate 58 of the PMOS transistor P6 is arranged over the active region 52.

As shown in FIG. 6A, the conventional dual port static memory is out of balance between the numbers of the PMOS transistors and the NMOS transistors; particularly, it has more PMOS transistors than NMOS transistors. Accordingly, layout size of the conventional memory cell is large.

However, as shown in FIG. 6B, the numbers of the PMOS transistors and NMOS transistors are in balence, so that layout size of the memory cell of the present invention is relatively smaller than that of the conventional memory cell.

In FIG. 6A corresponding to the circuit of FIG. 3, the NMOS transistors N7 and N8 are illustrated to have the same channel widths as the PMOS transistor P6 of the circuit of FIG. 4. Further, the simulation associated with Table 1 is performed assuming that the NMOS transistors N7 and N8 of the circuit of FIG. 3 have the same channel widths as the PMOS transistor P6 of the circuit of FIG. 4.

Accordingly, if the NMOS transistors N7 and N8 in the circuit of FIG. 3 are designed to have increased channel widths, total layout area of the memory cell of the circuit in FIG. 3 will be increased.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A dual port static memory cell comprising:
    a first transmission gate having a gate connected to a word line and connected between a bit line and a first node;
    a second transmission gate having a gate connected to the word line and connected between a complementary bit line and a second node;
    a latch connected between the first node and the second node; and
    a PMOS transistor having a gate connected to a scan control line and connected between the second node and a scan bit line.

2. The dual port static memory cell according to claim 1, wherein the first and second transmission gates are implemented by NMOS transistors.

3. The dual port static memory cell according to claim 1, wherein the latch comprises a first CMOS inverter for inverting a signal from the first node and outputting the inverted signal of the first node to the second node, and a second CMOS inverter for inverting a signal from the second node and transmitting the inverted signal of the second node to the first node.

4. A semiconductor memory device comprising:
    a plurality of memory cells connected between corresponding pairs of bit lines and corresponding word lines, while being arranged in a matrix;
    a plurality of scan transistors connected to corresponding scan bit lines, the corresponding memory cells and corresponding scan control lines, while being arranged in a matrix;
    a pre-charge means for pre-charging the plurality of bit line pairs; and
    a pre-discharge means for pre-discharging the scan bit lines,
    wherein each scan transistor includes a PMOS transistor connected between a corresponding memory cell of the memory cells and a corresponding scan control line of the scan control lines, the PMOS transistor having a gate connected to a corresponding scan control line of the scan control lines.

5. The semiconductor memory device according to claim 4, wherein the each memory cell comprises:
    a first NMOS transistor connected between a bit line of at least one of the bit line pairs and the first node, and having a gate connected to the word line;
    a second NMOS transistor connected between a complementary bit line of the bit line pair and the second node, and having a gate connected to the word line; and
    a latch connected between the first node and the second node.

6. The semiconductor memroy device according to claim 5, wherein the latch comprises:
    a first CMOS inverter for inverting a signal from the first node and transmitting the inverted signal to the second node; and
    a second CMOS inverter for inverting a signal from the second node and transmitting the inverted signal to the first node.

* * * * *